United States Patent
Stampka et al.

(10) Patent No.: US 7,605,453 B2
(45) Date of Patent: Oct. 20, 2009

(54) CHIP MODULE AND CHIP CARD

(75) Inventors: Peter Stampka, Burglengenfeld (DE); Frank Puschner, Kelheim (DE); Erik Heinemann, Regensburg (DE); Birgit Binder, Straubing (DE)

(73) Assignee: Infineon Technologies AG (DE)

( * ) Notice: Subject to any disclaimer, the term of this patent is extended or adjusted under 35 U.S.C. 154(b) by 536 days.

(21) Appl. No.: 11/464,064

(22) Filed: Aug. 11, 2006

(65) Prior Publication Data

US 2007/0034999 A1 Feb. 15, 2007

(30) Foreign Application Priority Data

Aug. 11, 2005 (DE) .................. 10 2005 038 132

(51) Int. Cl.
*H01L 23/02* (2006.01)
(52) U.S. Cl. ...................... 257/679; 257/678
(58) Field of Classification Search ............... 257/679, 257/680, 681, 678
See application file for complete search history.

(56) References Cited

U.S. PATENT DOCUMENTS

| | | | |
|---|---|---|---|
| 4,639,585 A * | 1/1987 | Haghiri-Tehrani et al. | .. 235/492 |
| 4,980,802 A | 12/1990 | Champagne et al. | |
| 5,097,117 A | 3/1992 | Champagne et al. | |
| 7,086,601 B2 * | 8/2006 | Dhers et al. | ......... 235/492 |
| 2009/0040695 A1 * | 2/2009 | Fidalgo et al. | ......... 361/679.31 |

FOREIGN PATENT DOCUMENTS

| | | |
|---|---|---|
| DE | 693 27 308 T2 | 8/2000 |
| DE | 697 01 142 T2 | 9/2000 |
| DE | 698 19 299 T2 | 7/2004 |
| EP | 0 207 852 | 1/1987 |
| EP | 0 297 991 | 1/1989 |
| EP | 0 343 030 | 11/1989 |
| EP | 0952542 | 10/1999 |
| EP | 1492048 | 12/2004 |
| EP | 0 862 134 B1 | 1/2005 |
| FR | 2684471 | 6/1993 |
| FR | 2749687 | 12/1997 |
| FR | 2786009 | 5/2000 |
| JP | 08-153946 | 6/1996 |

* cited by examiner

*Primary Examiner*—Sheila V Clark
(74) *Attorney, Agent, or Firm*—Dickstein, Shapiro, LLP.

(57) ABSTRACT

A chip module and to a chip card with a chip module which can be bent in such a way that a cross-sectional area runs along the greatest curvature of the bending line and parallel to one side of the chip module or the chip card. The module comprises contact areas within a surrounding line which are arranged in a plane perpendicular to the cross-sectional area, the surrounding line comprising a first line portion, which is adjacent the cross-sectional area, and a second line portion, which is opposite the first line portion. Furthermore, the module comprises a component, which is positioned in such a way that a first distance between the component and the first line portion is greater than a second distance between the component and the second line portion.

36 Claims, 3 Drawing Sheets

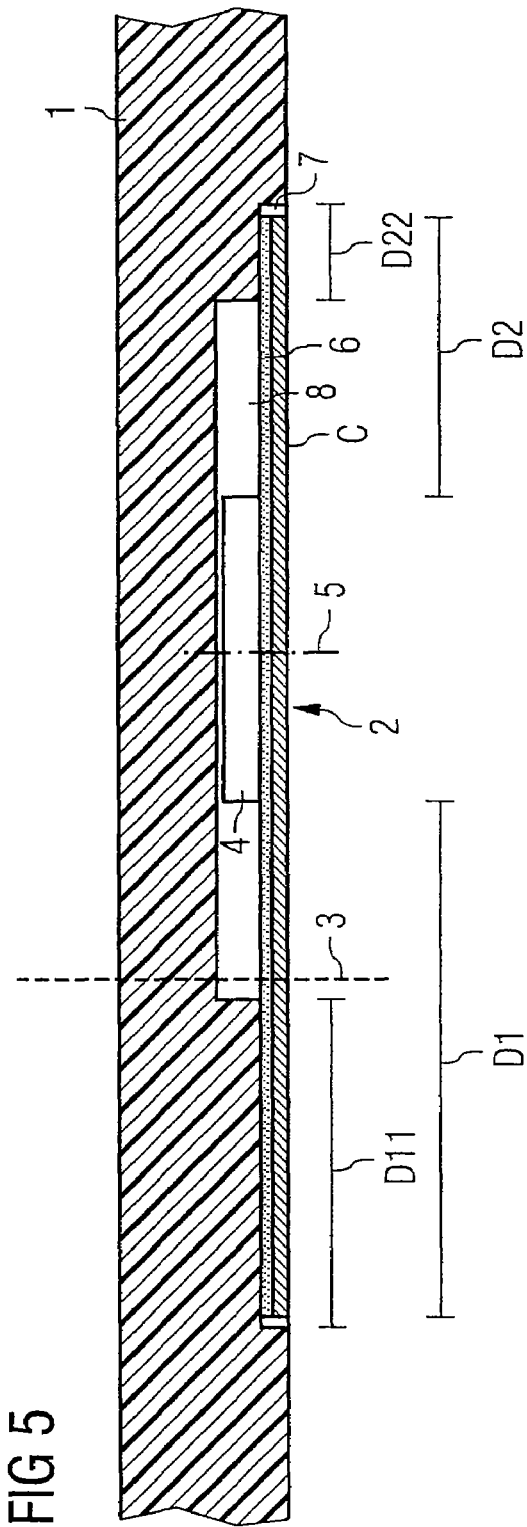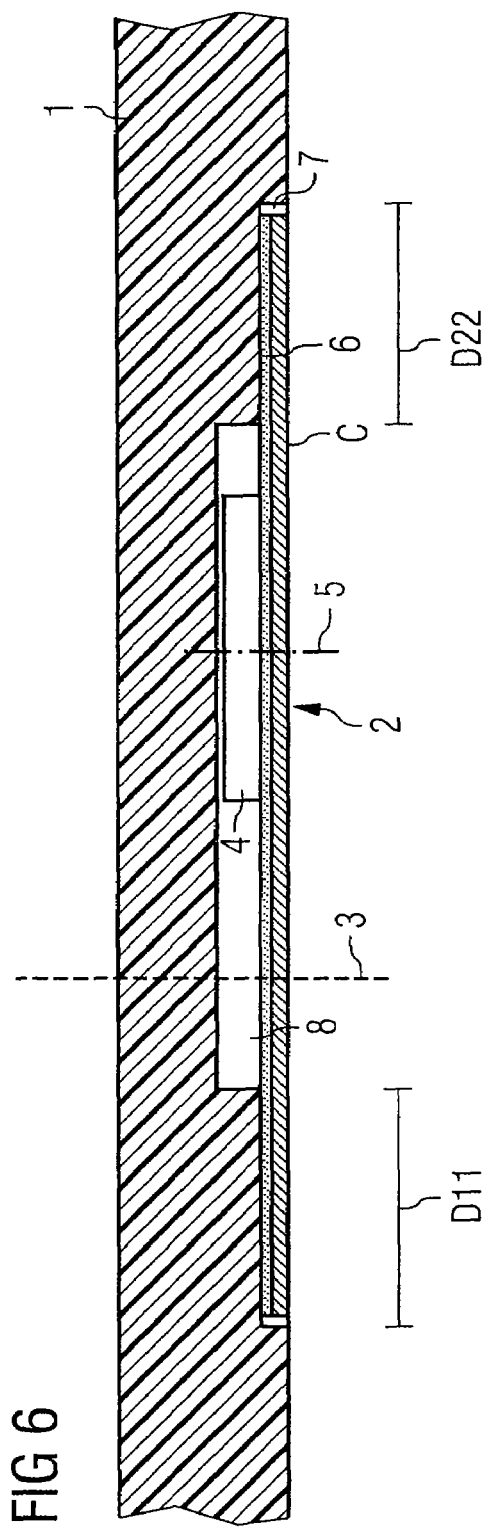

CHIP MODULE AND CHIP CARD

CROSS-REFERENCE TO RELATED APPLICATION

This application claims priority to German Patent Application Serial No. 102005038132.4, which was filed on Aug. 11, 2005, and is incorporated herein by reference in its entirety.

FIELD OF THE INVENTION

The invention relates to a chip module for a chip card and to a chip card.

BACKGROUND OF THE INVENTION

Chip cards are subjected to mechanical bending forces in daily use. These bending forces act on the card for example during transport, whether while they are being shipped or while they are being kept in a billfold, and can lead to permanent damage. Even if a card body is relatively insensitive to these flexural loads, the reversible deformations of the card that occur may lead to detachment of terminal contacts of the chips contacted in the card body, whereby the functionality of the card is destroyed.

The bending forces usually act on opposite sides of the chip card in such a way that the vertex of a bending line runs along one of the axes of symmetry of the chip card.

In particular in the case of chip cards with contact areas, the flexural loading may lead to permanent damage of the chip card. Chip cards with contact areas comprise the card body with a cavity, in which a chip module with a chip and contact areas is arranged in such a way that the contact areas are accessible from the outside and terminate as flush as possible with the surface of the card.

For reasons of symmetry and to simplify production, in the case of conventional chip modules the chip is positioned centrally in a region comprising the contact areas.

The deformation during bending of the card has the effect that the bending forces are transferred to the chip module incorporated in the card body. Deformation of said chip module may damage a connection between the terminal areas of the chip and the contact areas.

Previous attempts to increase the robustness of a chip card with respect to the dynamic bending stress are aimed at optimally matching the material composition of the chip card structure and of reducing and/or absorbing the bending stress that is transferred to the module. This takes place for example by using a highly flexible supporting material and a flexurally more rigid encapsulating material with very good adhesion with respect to the supporting material and the chip. This is intended to prevent the delamination, the detachment of the chip or its terminal areas, caused by the bending stress that is introduced.

With the widespread use of chip cards in a large number of application areas, standardized chip cards are often used, making it possible for chip cards and chip card reading and writing devices from different manufacturers and for different applications to operate together without any problem.

The arrangement of the contacts on a chip card usually conforms to ISO standard 7816/2. According to the standard, the contact areas are arranged on the axis of symmetry of the chip card running in the longitudinal direction. The bending forces often act on the longitudinal sides or on the transverse sides of the chip card. In the case of bending forces acting on the longitudinal sides of the chip card, the vertex of the bending line runs along the axis of symmetry of the longitudinal direction, so that in this case the greatest deformation occurs along this axis of symmetry.

In the case of the standardized chip cards known from the prior art, the greatest curvature of the bending line runs in the direct vicinity of the chip. Therefore, the deformations that are caused by bending and the resultant delamination forces are particularly great along the vertex line and may damage the sensitive contacting.

SUMMARY OF THE INVENTION

The module has a first side and a second side and can be bent in such a way that a cross-sectional area which is arranged perpendicular to the greatest curvature of a bending line of the module is parallel to the first side. The module comprises contact areas within a surrounding line, which are arranged in a plane perpendicular to the cross-sectional area, the surrounding line comprising a first line portion, which is adjacent the cross-sectional area, and a second line portion, which is opposite the first line portion. The module also comprises a component which is positioned in such a way that a first distance between the component and the first line portion is greater than a second distance between the component and the second line portion.

The chip card with two longitudinal sides and two transverse sides can be bent in such a way that the cross-sectional area which is arranged along a vertex line of the greatest curvature of the chip card is parallel to the longitudinal sides. The chip card comprises a module, which comprises contact areas. The contact areas are arranged within a surrounding line, which is arranged in a plane perpendicular to the cross-sectional area, the surrounding line comprising a first line portion, which is adjacent the cross-sectional area, and a second line portion, which is opposite the first line portion. The module also comprises a component which is positioned in such a way that a first distance between the component and the first line portion is greater than a second distance between the component and the second line portion.

BRIEF DESCRIPTION OF THE DRAWINGS

The invention is explained below with reference to the drawing on the basis of exemplary embodiments.

FIG. 5 shows a section through a first exemplary embodiment of the chip card.

FIG. 6 shows a section through a second exemplary embodiment of the chip card.

DETAILED DESCRIPTION OF THE INVENTION

Figure 1:
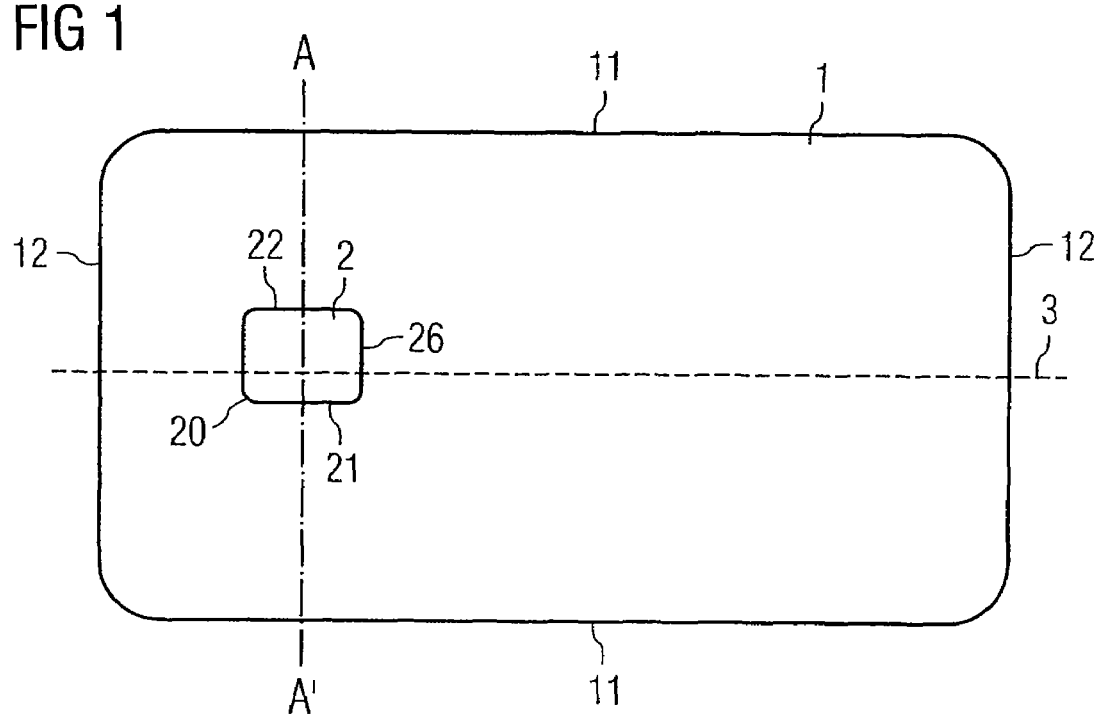
FIG. 1 shows a plan view of a chip card with contacts.

In the production of the chip card, usually the card is first contacted with the contact areas to form the chip module. The contact areas are usually applied to one side of a substrate. Arranged on the side opposite from the contact areas is the chip, which is connected to the contact areas through via holes in the substrate. It is also conceivable for the chips to be adhesively attached to the rear side of the contact areas provided with an adhesive layer, which without the substrate are formed as a so-called leadframe or flexible printed circuit board. It goes without saying that the adhesive may also be applied to the chip, in order to form the chip module by subsequent bonding with the flexible printed circuit board. By applying a further adhesive to the module, the latter can be fixed in the card body.

The chip module has a lower height in an outer region of the contact areas than in a central region in which the chip is provided. For fitting the chip card module in the card body, a cavity is provided in the card body. The cavity is formed in two stages and comprises an outer cavity, the base area and depth of which are adapted to the base area of the chip module and its height in the outer region. Furthermore, a depression of a smaller base area, the so-called inner cavity, is arranged in the bottom of the outer cavity. The chip module is inserted into the cavity in such a way that the chip is positioned in the inner cavity. The bottom of the outer cavity is provided as an adhesive border for the fixing of the chip module. In the case of conventional chip modules, the chip of which is centrally arranged, this is consistent with an adhesive border of uniform width formed by the bottom of the outer cavity, since the inner cavity is arranged centrally in the outer cavity.

For fixing the chip module in the card body, an adhesive bond is used. Usually, an adhesive is applied to the bottom of the outer cavity, formed as an adhesive border, and the module is consequently fixed. In addition, adhesive may be introduced in the inner cavity, also to fix the chip. As an alternative or in addition, the rear side of the chip module opposite from the contact areas may be provided with an adhesive, so that, when the chip module is inserted into the card body, the chip module is fixed on the bottom of the outer cavity.

The contacting of the chip with the contact areas may take place by wire connections, so-called wire-bonding connections, or by so-called flip-chip connections, in which the terminal contacts of the chip are positioned facing the contact areas and are connected to the latter directly or by means of interconnects and/or via holes. The contacted chip is often encapsulated to protect the contacting.

With regard to chip cards of small thickness, the flip-chip connections are to be preferred, since the wire-bonding connections protrude with the wires beyond the upper side of the chip and consequently result in a greater thickness of the chip module. However, the rigid flip-chip connections are susceptible to damage caused by deformations.

The standardized chip card comprises eight contact zones, six of which are already reserved for the transmission of predetermined signals and also used for this purpose, for example for applying a clock signal or for grounding. Two of the contact zones are reserved for user-specific applications and can be freely assigned. However, in approximately 95% of all chip card applications only the six predefined contact areas are used, so that the freely assignable contact areas are not required and are not contacted with the chip.

The asymmetrical positioning of the component on the contact areas in a region of lower deformation reduces the risk of delamination as a result of bending stress. Since the distance of the component from the axis of symmetry of the card is greater than in the case of symmetrical positioning, the delamination forces are reduced, since the critical connections are arranged at safe distances from the bending line along which the card, and the module, has the greatest curvature.

Since, in the case of standardized chip cards, the contact areas that are not required are adjacent the cross-sectional area which runs along the greatest curvature, the component is more advantageously positioned in such a way that its alignment is optimized with regard to the contact areas that are to be contacted. In an advantageous configuration, the component is aligned symmetrically on a connecting line of the contact areas designated in the standard as C2 and C6.

In particular when the flip-chip technique is used for contacting, the component can be positioned in such a way that its terminal contacts are arranged directly on the terminal areas or can be contacted by short connecting lines in a simple manner.

The chip module and the corresponding chip card with the chip module can be bent in such a way that a bending line runs along one side of the chip module or the chip card, the greatest curvature of the bending line occurring along a cross-sectional area. This cross-sectional area runs perpendicularly to the bending line.

When such a chip module is fitted in the chip card, the distance of the component from the vertex of the bending line is greater than in the case of conventional chip cards. At the same time, neither the contacting areas nor their position on the chip card are changed, so that there is no non-compliance with the standard.

In a preferred development, the two-stage cavity of the card body, which comprises an outer cavity and an inner cavity, may be formed in such a way that the bottom border of the outer cavity has a constant width. As a result of this configuration, a symmetrical adhesive border is formed for the attachment of the contact areas. This has the advantage that the method for producing the card body does not have to be modified.

In an alternative configuration, the inner cavity is arranged in the outer cavity in such a way that the component is positioned symmetrically in the inner cavity. In this way, the component is additionally protected by the card body, since the component can be fitted into the card body virtually flush. The adhesive border left by this arrangement is wider in the vicinity of the vertex of the bending line than on the opposite side. This has the advantage that there is a large adhesive area in the region of the greatest deformation, which reduces the detachment of the module. Furthermore, the component fitted symmetrically into the inner cavity can have the effect of avoiding unevennesses of the contact areas, which possibly occur if the inner cavity is not adapted to the size or position of the component.

In the case of smaller components and modules with fewer contact areas, for example six contact areas, an eccentric arrangement of the component on the contact areas is likewise conceivable. This may also be accompanied by an eccentrically arranged inner cavity.

FIG. 1 shows a plan view of a chip card with contacts, as used for example as an EC card or phone card, with a chip module 2 inserted into a card body 1. The format of such cards is referred to as ID1. Provided in the card body 1 is a cavity, into which the chip module 2 is inserted. The chip module 2 comprises contact areas and a component and is inserted in the chip card in such a way that the contact areas are accessible from the outside, in order to make the data exchange with the chip card possible. The position of the contact areas, and consequently also of the chip module 2, are prescribed by standardization.

During use of the chip card, flexural forces usually act on the longitudinal sides 11 or on the transverse sides 12 of the card body 1 in such a way that a greatest curvature of the bending line occurs at the axes of symmetry of the chip card. It should be noted that the bending line is understood as meaning the path of the curvature caused by the bending forces. In the case of bending forces acting on the longitudinal side 11, the bending line is the resultant flexure of the card, which can be seen in a section parallel to the transverse sides 12, for example along the line A-A'. For the chip module 2, the bending line runs along the side 26. The vertex of this bending line runs along the axis of symmetry 3 in the longitudinal direction. In the case of the standardized chip card, the chip module 2 is positioned on the locus of the vertex of the bending line. The chip module 2 is arranged in the card body 2 in such a way that a lower portion 21 of a surround 20 of the contact areas is nearer the axis of symmetry 3 than an upper portion 22 of the surround 20. It is also conceivable to arrange the chip module not on the axis of symmetry 3 but for example somewhat above it. In this case, too, a portion of the surround is adjacent the axis of symmetry 3. The greatest curvature of the module 2 would in this case then run along its lower edge 21.

The axis of symmetry 3 is a vertex line of the greatest curvature of the chip card and runs parallel to the longitudinal side 11 of the chip card. The externally accessible contact areas of the chip module 2 are arranged perpendicular to a sectional area which runs perpendicularly to the greatest curvature along the vertex line 3.

Figure 2:
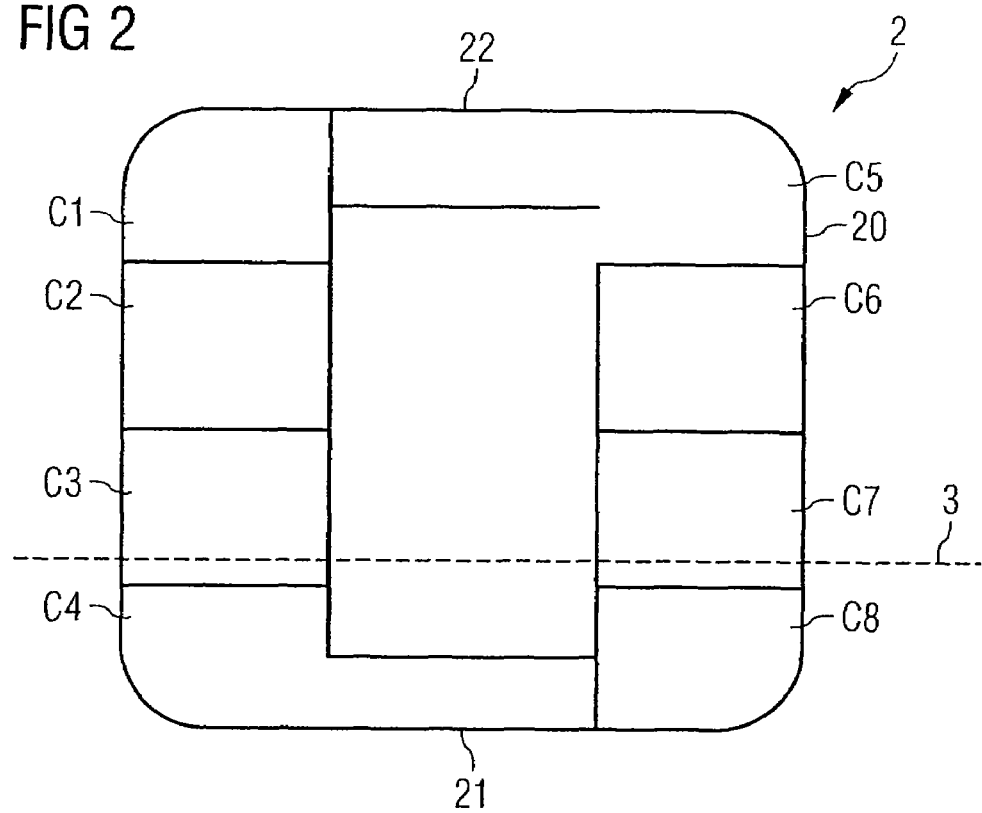
FIG. 2 shows a plan view of contact areas of the chip card with contacts.

FIG. 2 shows a plan view of the contact areas C1, C2, C3, C4, C5, C6, C7, C8. This view coincides substantially with a plan view of the chip module 2, the base-area extent of which is determined by the contact areas. Such an arrangement of the contact areas C1, C2, C3, C4, C5, C6, C7, C8 conforms to ISO standard 7816/2. The axis of symmetry 3 of the card 1 at which the greatest curvature of the bending line occurs runs in such a way that the contact areas C3, C4 and C7, C8 are affected most by the flexural deformation.

Figure 3:
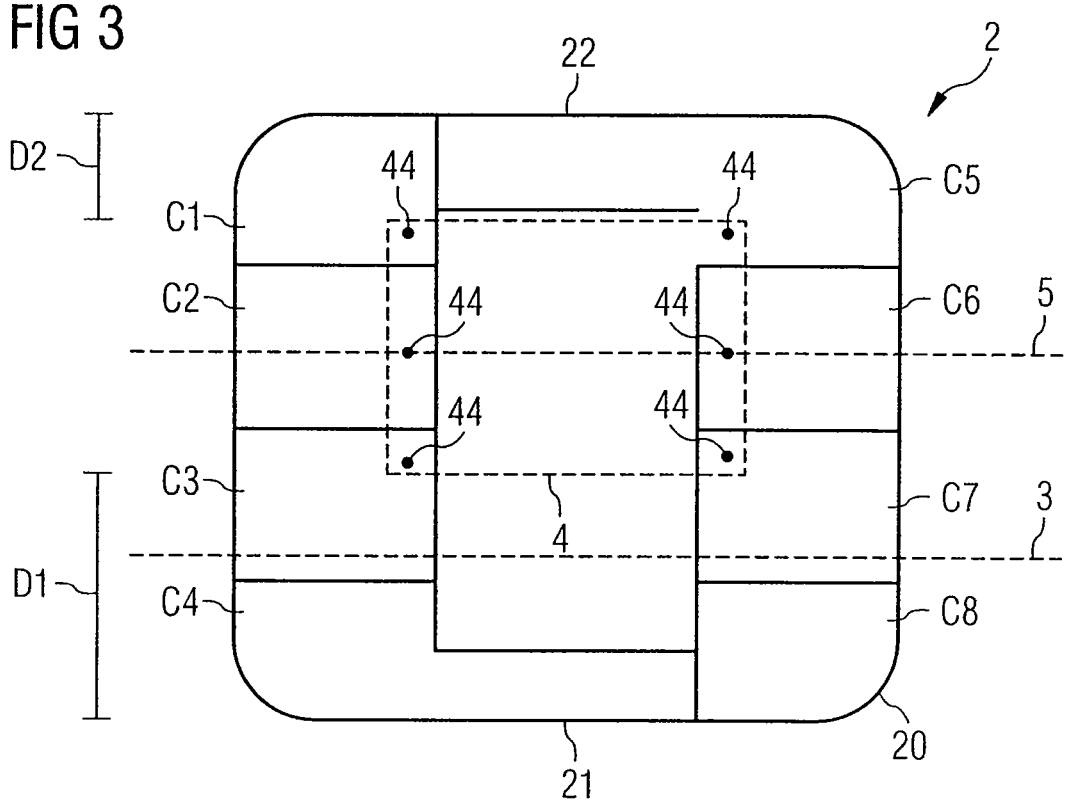
FIG. 3 shows a plan view of a first exemplary embodiment of a chip module.

FIG. 3 shows a plan view of a first exemplary embodiment of the chip module 2 with the contact areas C1, C2, C3, C4, C5, C6, C7, C8, and the arrangement of a component 4, which is usually formed as a semiconductor chip with an integrated circuit. The component 4 comprises six terminals (not shown) and is positioned on the contact areas C1, C2, C3, C5, C6, C7 in such a way that each of these terminals is arranged on one of the contact areas C1, C2, C3, C5, C6, C7. Contacting with the contact areas C4 and C8 is not envisaged.

The contacting of the component 4 with the contact areas C1, C2, C3, C5, C6, C7 takes place by the flip-chip technique, for example by means of via holes 44. In this case, the component 4 is arranged substantially centrally on a region comprising the contact areas C1, C2, C3, C5, C6, C7 that are to be contacted. The arrangement of the component 4 preferably takes place on a line 5 which runs between the contact areas C2 and C6, and, in the region comprising the contact areas C1, C2, C3, C5, C6, C7 that are to be contacted, runs approximately centrally in the longitudinal direction of the chip card.

The arrangement of the component 4 means that a first distance D1 of the component 4 from the lower region 21 of the surrounding line 20 of the contact areas C1, C2, C3, C4, C5, C6, C7, C8 is greater than a second distance D2 from the upper region 22 of the surrounding line 20. As a result, the component 4 and its contacting 44 are no longer arranged in the region of the axis of symmetry 3 of the chip card at which the greatest flexural loads occur. Rather, the component is positioned in a region of less flexural deformation. The described arrangement of the component 4 is also of advantage when the module is arranged somewhat above the axis of symmetry of the chip card.

Figure 4:
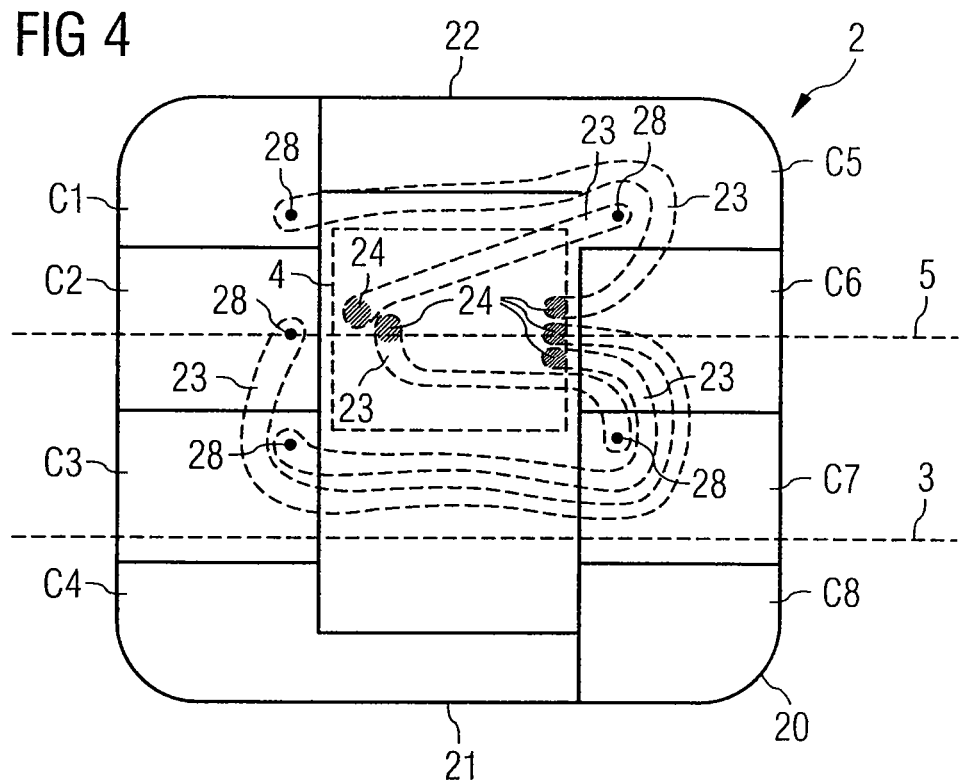
FIG. 4 shows a plan view of a second exemplary embodiment of the chip module.

FIG. 4 shows a second exemplary embodiment of the chip module 2 with the component 4, which is contacted with the contact areas C1, C2, C3, C5, C7. In this case, the contacting comprises not only the via holes 28 but also connecting lines 23 arranged on the opposite side of the contact areas C1, C2, C3, C4, C5, C6, C7, C8, which connect the terminal contacts 24 of the component by means of the via holes 28 to the contact areas C1, C2, C3, C5 and C7. In this case, C6 is not contacted.

In this exemplary embodiment, too, the component 4 is not arranged in the direct vicinity of the axis of symmetry 3, so that the bending stress acting on the connecting lines 23 and the terminal contacts 24 of the component is reduced. The connecting lines 23 are also advantageously arranged outside the region with the greatest bending stress. In this case, too, the connection of the component takes place by the flip-chip technique.

It goes without saying that it is also conceivable to connect the component to the contact areas by other contacting techniques, for example by wire-bonding connections. In this case, too, the way in which the component 4 is arranged according to the invention leads to reduced flexural loading of the connections.

Also in the case of additional connection of the component 4, arranged as in FIG. 4, with the contact areas C4 and C8 by means of further connecting lines 23, the connections of the terminal contacts of the component 4 to the connecting lines 23 would be exposed to less flexural loading than in the case of a central arrangement of the component 4 within the surround 20 of the contact areas C1, C2, C3, C4, C5, C6, C7, C8. This applies in particular since the connecting lines 23 are usually less sensitive to bending stress than the more rigid component and its flip-chip contacting. Bending stress which acts on the connecting lines 23 can be tolerated rather more than bending stress acting on the component 4 and its terminal contacts 24.

FIG. 5 shows a section through an exemplary embodiment of a chip card. The section runs along the line A-A' represented in FIG. 1.

The chip module comprises the contact areas C, on the rear side of which an adhesive layer 6 is applied. On the rear side of the contact areas, the component 4 is arranged and connected to the contact areas C. The adhesive layer 6 serves for the fixing of the chip module 2 in the card body 1. The component 4 is usually mounted with a suitable adhesive on the contact areas C already for the production of the module.

The card body 1 has a two-stage cavity 7, 8. The cavity 7, 8 comprises a shallower outer cavity 7, which is dimensioned in such a way that the contact areas C of the chip module can be inserted as flush as possible. Formed within the outer cavity 7 is a further recess with a smaller base area, an inner cavity 8, which is intended for receiving the component 7 mounted on the contact areas C.

In the exemplary embodiment represented, the inner cavity 8 is arranged asymmetrically within the outer cavity 7. The component 4 is not arranged centrally on the contact areas C but in such a way that the first distance Dl from the component 4 to the edge of the contact areas C which is adjacent the vertex 3 of the bending line is greater than the distance D2 from the component 4 to the opposite edge of the contact areas C. Consequently, the component 7 is positioned approximately centrally within the inner cavity 8. The distance D11 between an edge portion of the inner cavity and the adjacent edge portion of the outer cavity which is adjacent the vertex 3 of the greatest curvature is greater than the distance D22 from the opposite edge portion of the inner cavity to the adjacent edge portion of the outer cavity 7. It is evident that the component 4 does not intersect the line 3 of greatest curvature but is arranged along the line 5.

It goes without saying that it is also conceivable for the inner cavity 7 to be dimensioned in such a way that it receives the component 4 virtually flush. In this case, the protection of the component 4 is improved.

FIG. 6 shows a second exemplary embodiment, which comprises an alternative configuration of the two-stage cavity 7, 8. In this case, the inner cavity 8 is arranged symmetrically or centrally within the outer cavity 7. The distances D11, D22 of the adjacent edge portions from the inner cavity 8 to the outer cavity 7 are the same. Since, however, the component is not arranged symmetrically or centrally on the contact areas C, the component 4 is not positioned centrally in the inner cavity after the chip module 2 is fitted.

This exemplary embodiment is of advantage if only the production of the chip module is to be modified, without interfering with the production of the card body. This allows the advantages of the invention to be used while incurring low costs and little effort.

What is claimed is:

1. A bendable chip module comprising:
    a first edge;
    a second edge that substantially parallel to the first edge;
    contact areas positioned between the first edge and the second edge; and
    an electronic component positioned on at least one of the contact areas,
    wherein the electronic component is offset such that it is positioned closer to the first edge than the second edge, and
    wherein a greatest curvature of a bending line is substantially parallel to the first edge and the second edge, and is located between the first edge and the second edge.

2. The bendable chip module as claimed in claim 1, wherein the electronic component is contacted with at least one group of the contact areas by the flip-chip technique.

3. The bendable chip module as claimed in claim 1, wherein the electronic component is contacted with at least one group of the contact areas by wiring-bonding connections.

4. The bendable chip module as claimed in claim 1, wherein the contact areas comprise first contact areas in contact with the electronic component, and second contact areas not in contact with the electronic component.

5. The bendable chip module as claimed in claim 4, wherein the electronic component is contacted with the first contact areas by the flip-chip technique.

6. The bendable chip module as claimed in claim 1, wherein the contact areas are arranged to conform to ISO standard 7816/2.

7. The bendable chip module as claimed in claim 6, wherein the electronic component is positioned on an axis of symmetry of the contact areas designated according to ISO standard 7816/2 as C2 and C6.

8. The bendable chip module as claimed in claim 1, wherein the electronic component is a semiconductor chip with an integrated circuit.

9. The bendable chip module as claimed in claim 1, wherein the contact areas comprise terminal contacts arranged on one side and connecting lines arranged on the opposite side, and the connecting lines couple the terminal contacts to the contact areas by via holes.

10. A chip card with two longitudinal sides and two transverse sides, the chip card being bendable such that a vertex line of a greatest curvature of the chip card is parallel to the longitudinal sides, and the chip card having a bendable chip module comprising:
    contact areas positioned between and first edge and a second edge, which is positioned substantially parallel to the first edge; and
    an electronic component positioned on at least one of the contact areas, such that a first distance between the electronic component and the first edge is greater than a second distance between the electronic component and the second edge.

11. The chip card as claimed in claim 10, wherein the electronic component is contacted with at least one group of the contact areas by the flip-chip technique.

12. The chip card as claimed in claim 10, wherein the electronic component is contacted with at least one group of the contact areas by wire-bonding connections.

13. The chip card as claimed in claim 10, wherein the contact areas comprise first contact areas in contact with the electronic component, and second contact areas not in contact with the electronic component.

14. The chip card as claimed in claim 13, wherein the electronic component is contacted with the first contact areas by the flip-chip technique.

15. The chip card as claimed in claim 10, wherein the contact areas are arranged to conform to ISO standard 7816/2.

16. The chip card as claimed in claim 15, wherein the electronic component is positioned on an axis of symmetry of the contact areas designated according to ISO standard 7816/2 as C2 and C6.

17. The chip card as claimed in claim 10, wherein the chip card has on an upper side a two-stage recess, which comprises an outer cavity with an outer border and a bottom and an inner cavity, cut out in the bottom, with an inner border, into which the bendable chip module is sunk such that the electronic component is positioned in the inner cavity.

18. The chip card as claimed in claim 17, wherein the inner border is aligned such that it is centered with the outer border.

19. The chip card as claimed in claim 17, wherein the inner border is aligned with the outer border such that a distance between an edge of the inner border which is adjacent to the first edge of the bendable chip module and an adjacent edge of the outer border is greater than a distance between an edge of the inner border, which is adjacent the second edge of the bendable chip module and an adjacent edge of the outer border.

20. The chip card as claimed in claim 19, wherein the bendable chip module is aligned symmetrically on an axis of symmetry of the inner border.

21. The chip card as claimed in claim 10, wherein the electronic component is a semiconductor chip with an integrated circuit.

22. The chip card as claimed in claim 10, wherein the contact areas comprise terminal contacts arranged on one side and connecting lines arranged on the opposite side, and the connecting lines coupled the terminal contacts to the contact areas by of via holes.

23. The chip card as claimed in claim 10, wherein the bendable chip module is fixed to the chip card with an adhesive bond.

24. A bendable chip card with two longitudinal sides and two transverse sides, the bendable chip card having an axis of symmetry, which is parallel to the longitudinal sides and comprising a bendable chip module having:
    contact areas positioned between a first edge and a second edge, which is substantially parallel to the first edge; and
    en electronic component, which is positioned on at least one of the contact areas and is offset such that it is positioned closed to the first edge than the second edge
    wherein the axis of symmetry is substantially parallel to the first edge and the second edge, and is located between the first edge and the second edge.

25. The chip card as claimed in claim 24, wherein the contact areas comprise first contact areas in contact with the electronic component, and second contact areas not in contact with the electronic component.

26. The chip card as claimed in claim 25, wherein the electronic component is contacted with the first contact areas by the flip-chip technique.

27. The chip card as claimed in claim 25, wherein the electronic component is contacted with the first contact areas by wire-bonding connections.

28. The chip card as claimed in claim 24, wherein the contact areas are arranged to conform to ISO standard 7816/2.

29. The chip card as claimed in claim 28, wherein the electronic component is positioned on a central line in the region, which comprises the contact areas designated according to ISO standard 7816/2 as C1, C2, C3, C5, C6 and C7.

30. The chip card as claimed in claim 24, wherein the chip card has on an upper side a two-stage recess, which comprises an outer cavity with an outer border and a bottom and an inner cavity, cut out in the bottom, with an inner border, into which the bendable chip module is sunk such that the electronic component is positioned in the inner cavity.

31. The chip card as claimed in claim 30, wherein the inner border is aligned such that it is centered with the outer border.

32. The chip card as claimed in claim 30, wherein the inner border is aligned with the outer border such that a distance between an edge of the inner border which is adjacent to the first edge of the bendable chip module and an adjacent edge of the outer border is greater than a distance between an edge of the inner border, which is adjacent the second edge of the bendable chip module and an adjacent edge of the outer border.

33. The chip card as claimed in claim 32, wherein the bendable chip module is aligned symmetrically on a further axis of symmetry, which is an axis of symmetry of the inner border, and wherein the further axis of symmetry is aligned parallel to the axis of symmetry.

34. The chip card as claimed in claim 24, wherein the electronic component is a semiconductor chip with an integrated circuit.

35. The chip card as claimed in claim 24, wherein the contact areas comprise terminal contacts arranged on one side and connecting lines arranged on the opposite side, and the connecting lines couple the terminal contacts to the contact areas by of via holes.

36. The chip card as claimed in claim 24, wherein the bendable chip module is fixed to the chip card with an adhesive bond.

* * * * *